US011204203B2

(12) United States Patent
Kim et al.

(10) Patent No.: US 11,204,203 B2
(45) Date of Patent: Dec. 21, 2021

(54) FLEXIBLE THERMAL CONDUCTOR AND MANUFACTURING METHOD THEREOF

(71) Applicant: KOREA ADVANCED INSTITUTE OF SCIENCE AND TECHNOLOGY, Daejeon (KR)

(72) Inventors: Sung Jin Kim, Daejeon (KR); Chuljae Jung, Daejeon (KR); Jonghyun Lim, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 116 days.

(21) Appl. No.: 16/563,347

(22) Filed: Sep. 6, 2019

(65) Prior Publication Data

US 2020/0217594 A1 Jul. 9, 2020

(30) Foreign Application Priority Data

Jan. 4, 2019 (KR) ........................ 10-2019-0001055

(51) Int. Cl.

*F28D 15/00* (2006.01)
*F28D 15/02* (2006.01)
*H05K 7/20* (2006.01)

(52) U.S. Cl.

CPC ....... *F28D 15/0266* (2013.01); *F28D 15/025* (2013.01); *F28D 15/0241* (2013.01); *H05K 7/20336* (2013.01)

(58) Field of Classification Search

CPC ............. F28D 15/0266; F28D 15/0241; F28D 15/025; H05K 7/20336

(Continued)

(56) References Cited

U.S. PATENT DOCUMENTS 7,819,174 B2 * 10/2010 Huang ................ F28D 15/0266
165/80.4
8,919,426 B2 12/2014 Hardesty (Continued)

FOREIGN PATENT DOCUMENTS

JP 2003042674 A 2/2003
JP 2003046045 A 2/2003

(Continued)

OTHER PUBLICATIONS

Korean Office Action for Application No. 10-2019-0001055, dated Feb. 20, 2020.

(Continued)

*Primary Examiner* — Claire E Rojohn, III
(74) *Attorney, Agent, or Firm* — Nixon Peabody LLP; Thomas P. Pavelko

(57) ABSTRACT

Provided are a flat plate pulsating heat pipe having flexibility and having an improved sealing ability so as not to leak a working fluid therein, and a manufacturing method thereof. The flat plate pulsating heat pipe includes a base part having an upper surface or a lower surface which is plasma-treated, wherein the base part has a plurality of channels formed therein and both end portions of each of the channels are bent and connected to each other to form a closed-loop type or a closed type; and a pair of surface films bonded to an upper portion and a lower portion of the base part and bonded to each other at an outer portion of the base part to seal the channels.

7 Claims, 6 Drawing Sheets

(58) Field of Classification Search
USPC .................................................... 165/104.29
See application file for complete search history.

(56) References Cited

U.S. PATENT DOCUMENTS

| | | | | | |
|---|---|---|---|---|---|
| 9,007,771 | B2 * | 4/2015 | Agostini | F28D 1/0435 361/701 |
| 9,132,439 | B2 * | 9/2015 | Morioka | F24F 6/12 |
| 9,341,418 | B2 * | 5/2016 | Arvelo | F28F 1/00 |
| 10,082,349 | B2 * | 9/2018 | Wang | H01L 23/473 |
| 10,712,098 | B2 * | 7/2020 | Kurashima | H01L 23/3736 |
| 10,816,274 | B2 * | 10/2020 | Naito | F28D 15/0233 |
| 10,820,448 | B2 * | 10/2020 | Hui | H05K 7/20272 |
| 11,002,290 | B2 * | 5/2021 | Cerny | F28D 9/04 |
| 2004/0069459 | A1 * | 4/2004 | Tonosaki | F28D 15/0266 165/104.25 |
| 2007/0122672 | A1 * | 5/2007 | Kweon | H01M 8/023 429/413 |
| 2009/0101308 | A1 * | 4/2009 | Hardesty | F28D 15/0233 165/80.4 |
| 2009/0228082 | A1 * | 9/2009 | Ross, III | A61F 7/02 607/107 |
| 2010/0219401 | A1 * | 9/2010 | Bradley | B82Y 40/00 257/40 |
| 2011/0017431 | A1 * | 1/2011 | Yang | F28D 15/04 165/104.26 |
| 2011/0311767 | A1 * | 12/2011 | Elahee | C08K 5/11 428/138 |
| 2014/0262192 | A1 * | 9/2014 | Boday | C09J 5/06 165/185 |
| 2016/0161193 | A1 * | 6/2016 | Lewis | B81C 1/00388 165/104.26 |
| 2018/0299206 | A1 * | 10/2018 | Kim | B32B 37/0076 |
| 2020/0335566 | A1 * | 10/2020 | Yu | H01L 27/3262 |

FOREIGN PATENT DOCUMENTS

| | | | | |
|---|---|---|---|---|
| KR | 101656857 B1 | | 9/2016 | |
| KR | 101656857 B2 | | 9/2016 | |
| KR | 10-1801823 B1 | | 11/2017 | |
| KR | 101801823 B1 | | 11/2017 | |
| TW | 201420990 A | | 6/2014 | |
| WO | WO-2016060350 A1 | * | 4/2016 | H05K 7/20318 |

OTHER PUBLICATIONS

Japanese Office Action for Application No. 2020-000252 dated Dec. 18, 2020.

TW Office Action and Search Report for Application No. 108135487, dated Jul. 29, 2020.

* cited by examiner

– Prior Art –

FLEXIBLE THERMAL CONDUCTOR AND MANUFACTURING METHOD THEREOF

CROSS-REFERENCE TO RELATED APPLICATIONS

This application claims priority under 35 U.S.C. § 119 to Korean Patent Application No. 10-2019-0001055, filed on Jan. 4, 2019, in the Korean Intellectual Property Office, the disclosure of which is incorporated herein by reference in its entirety.

TECHNICAL FIELD

The following disclosure relates to a flexible thermal conductor and a manufacturing method thereof.

BACKGROUND

Various flexible electronic devices such as a smart watch, a wearable device, and the like have been recently developed. As performance of these devices increases, the amount of generated heat is also increased. In particular, local heat generation may occur in these electronic devices. As a result, it may cause an excessive temperature increase in a specific portion of the electronic devices, which may cause a problem in the electronic devices and may pose a safety risk to a user. Therefore, in order to solve the above-mentioned problems, it is necessarily required to apply a suitable heat dissipating device to these electronic devices.

As a heat dissipating device or a cooling device, a heat pipe is mainly used. A typical heat pipe includes an empty space and a wick structure. The thinner the heat pipe, the narrower the space in which a vaporized working fluid moves due to the wick structure thereof, which results in a rapid decrease in performance thereof. Therefore, there is a limit in applying the heat pipe to ultra-thin electronic devices. To overcome the above-mentioned problem, a pulsating heat pipe has been proposed. As illustrated in FIG. 1, the pulsating heat pipe includes a smooth micro tube bundle without the wick structure, and an aligned slug-train unit including a liquid slug and a vapor plug in the tube pulsates and transfers heat. The pulsating heat pipe may be manufactured to be thin because it does not have the wick structure therein and has a simple structure, which is suitable for application to microelectronic devices.

In order to allow the conventional pulsating heat pipe as illustrated in FIG. 1 to have flexibility, the applicant has filed and registered Korean Patent Publication No. 10-1801823 ("Polymer-Based Pulsating Heat Pipe and Manufacturing Method thereof", published on Nov. 21, 2017, Related Art 1).

A configuration of the related art 1 will be briefly described. An upper film and a lower film are thermally bonded to each other while having a base part forming a channel of a working fluid interposed therebetween, and the base part is formed of a material having flexibility, thereby manufacturing a heat pipe having flexibility. A thermal bonding method used in the related art 1 is a method of melting the base part and then bonding the upper film and the lower film to each other. As a result, a shape of the pipe is deformed into a circle, which results in a decrease in performance of the pulsating heat pipe. In the case of the related art, when a surface film is bonded to a side portion, a polymer is exposed to the outside. Therefore, there is a problem that non-condensed gas penetrates into the pulsating heat pipe from the outside and the performance of the pulsating heat pipe is decreased.

RELATED ART DOCUMENT

Patent Document

Korean Patent Publication No. 10-1801823 ("Polymer-Based Pulsating Heat Pipe and Manufacturing Method thereof", published on Nov. 21, 2017)

SUMMARY

An embodiment of the present invention is directed to providing a flexible thermal conductor having flexibility and having an improved sealing ability to prevent a working fluid inside from being leaked and to prevent gas from penetrating into the pulsating heat pipe from the outside, and a manufacturing method thereof.

In one general aspect, a flexible thermal conductor includes: a base part forming channels and having an upper surface or a lower surface which is plasma-treated, wherein the channels are fluid passages; and a pair of surface films bonded to an upper portion and a lower portion of the base part and bonded to each other at an outer portion of the base part to seal the channels.

The flexible thermal conductor may be a flexible flat plate pulsating heat pipe, and the base part may have a plurality of channels formed therein, and both end portions of each of the channels may be bent and connected to each other to form a closed-loop type or a closed type.

The plasma-treated upper surface or lower surface of the base part may be siloxane-based surface modified and be then bonded to the surface films.

The siloxane-based surface modified upper surface or lower surface of the base part may be plasma-treated again and be then bonded to the surface films.

The surface films may include blocking layers preventing gas penetration so that the channels maintain a vacuum state, and each having one surface which is in contact with the base part; and film layers formed on the other surfaces of the blocking layers.

One surface of each of the blocking layers is coated with a silicon-based material and is then in contact with the base part such that the surface films and the base part may be bonded to each other.

One surface of each of the blocking layers coated with the silicon-based material is plasma-treated and is then in contact with the base part such that the surface films and the base part may be bonded to each other.

The base part and the surface films may be pressurized and be bonded to each other.

The base part and the surface films may be heated and be bonded to each other.

The blocking layers may be formed of a metal material.

The base part may be formed of a thermoplastic polymer.

The pair of surface films may be soldered or welded at the outer portion of the base part and be bonded to each other.

In another aspect, a manufacturing method of a flexible thermal conductor includes: a) plasma-treating an upper surface or a lower surface of a base part in which channels are formed, wherein the channels are fluid passages; and b) covering an upper portion and a lower portion of the base part with a pair of surface films, bonding the base part and the pair of surface films to each other, and bonding the pair of surface films to each other at an outer portion of the base part to seal the channels.

The manufacturing method of a flexible thermal conductor may be a manufacturing method of a flexible flat plate pulsating heat pipe, and in step a), the base part may have a plurality of channels formed therein, and both end portions of each of the channels may be bent and connected to each other to form a closed-loop type or a closed type.

In step a), the plasma-treated upper surface or lower surface of the base part may be siloxane-based surface modified.

In step a), the siloxane-based surface modified upper surface or lower surface of the base part may be plasma-treated again.

The surface films may include blocking layers preventing gas penetration so that the channels maintain a vacuum state, and each having one surface which is in contact with the base part; and film layers formed on the other surfaces of the blocking layers, and in step b), one surface of each of the blocking layers is coated with a silicon-based material and is then in contact with the base part such that the surface films and the base part may be bonded to each other.

In step b), one surface of each of the blocking layers coated with the silicon-based material is plasma-treated and is then in contact with the base part such that the surface films and the base part may be bonded to each other.

In step b), the base part and the surface films may be pressurized and be bonded to each other.

In step b), the base part and the surface films may be heated and be bonded to each other.

In step b), the pair of surface films may be soldered or welded at the outer portion of the base part and be bonded to each other.

DETAILED DESCRIPTION OF EMBODIMENTS

Hereinafter, exemplary embodiments of a flexible thermal conductor according to the present invention will be described in detail with reference to the accompanying drawings.

[Flexible Thermal Conductor]

Figure 1:
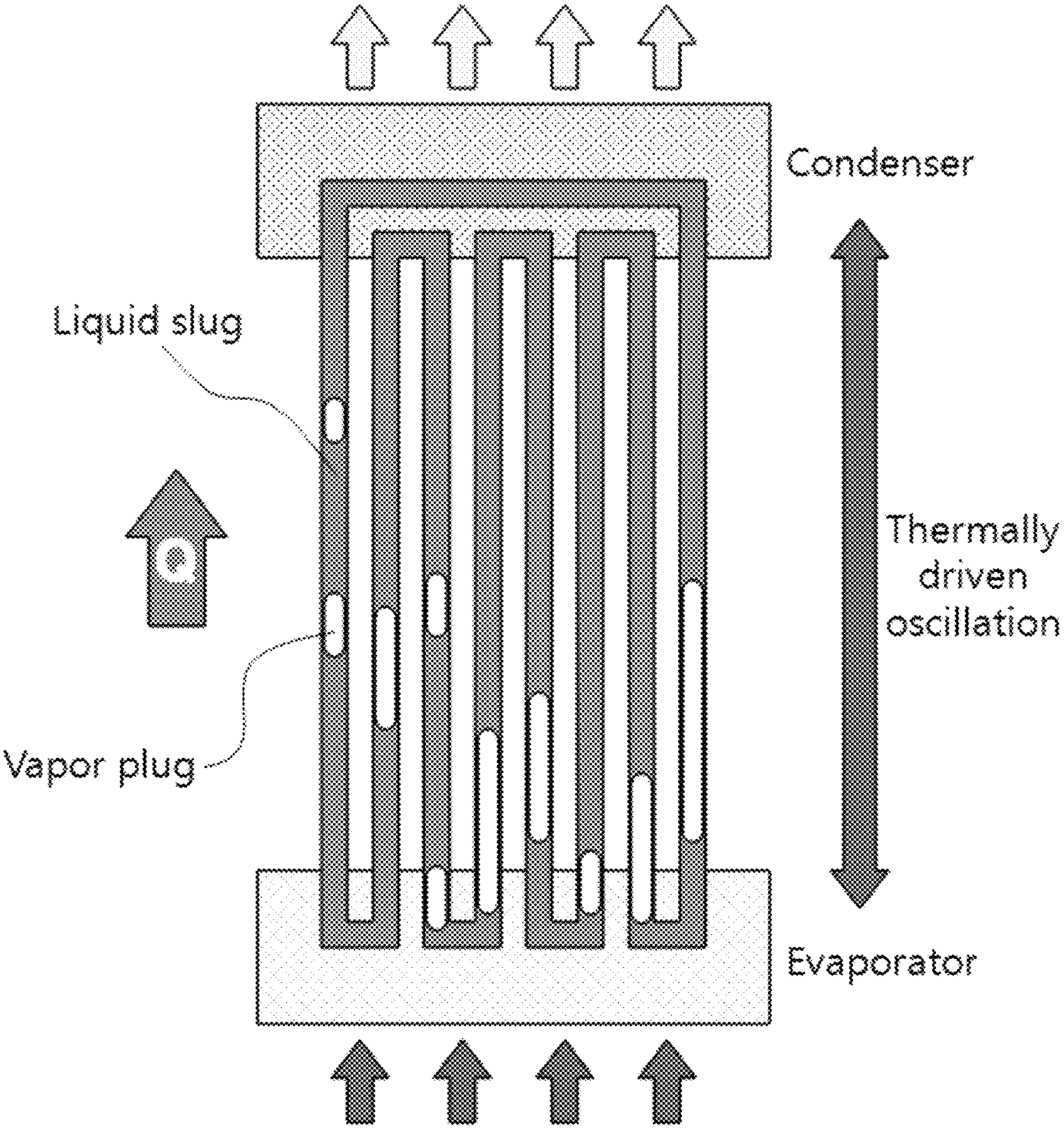
FIG. 1 is a schematic view illustrating an operation principle of a typical pulsating heat pipe.
Figure 2:
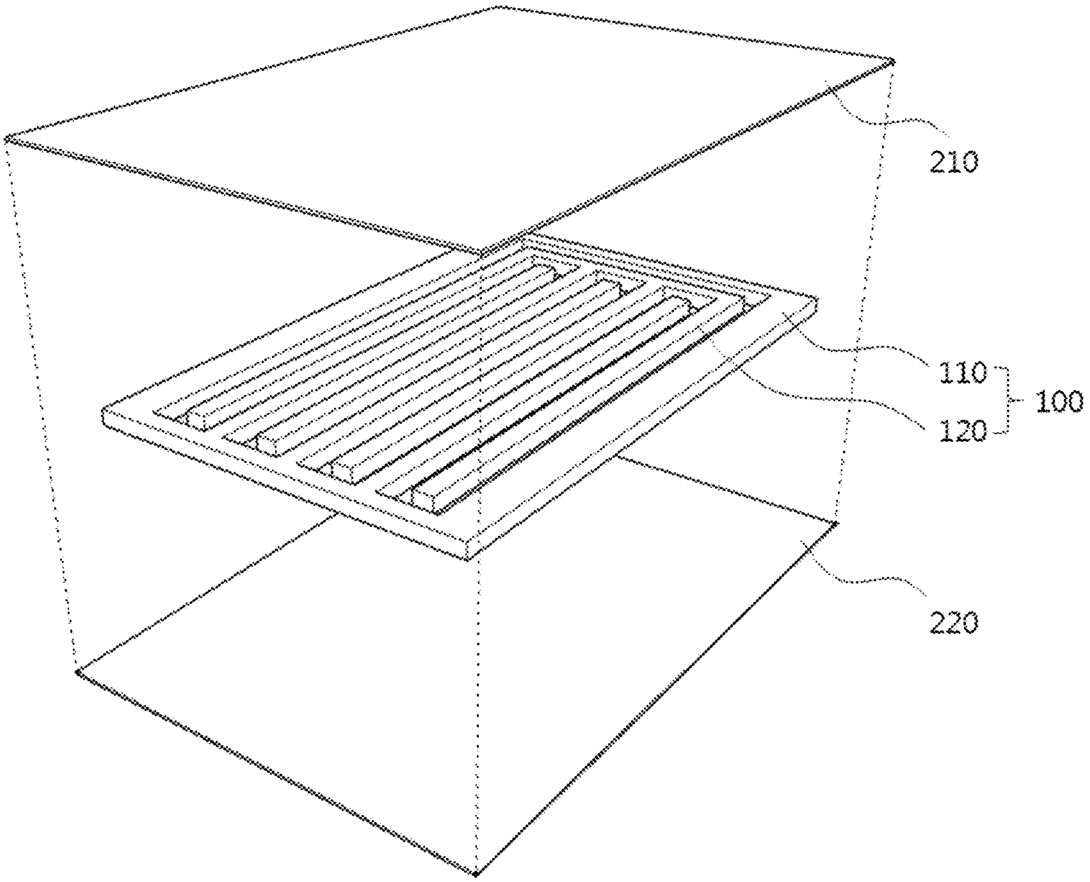
FIG. 2 is an exploded perspective view of a flexible thermal conductor according to an exemplary embodiment of the present invention.

FIG. 2 illustrates a state in which a flexible thermal conductor according to an exemplary embodiment of the present invention is disassembled.

As illustrated in FIG. 2, a flexible thermal conductor according to an exemplary embodiment of the present invention may include a base part 100 and surface films. The flexible thermal conductor according to an exemplary embodiment of the present invention illustrated in FIG. 2 is a flexible flat plate pulsating heat pipe. Here, the present invention is not limited to the flexible flat plate pulsating heat pipe illustrated in FIG. 2, but may be applied to various forms of flexible thermal conductors.

The base part 100, which is a member forming a plurality of channels, may include a first base member 110 and a second base member 120 which are formed to be separated from each other as illustrated in FIG. 2. The first base member 110 and the second base member 120 are separated from each other and are disposed on the same plane. The first base member 110 and the second base member 120 are disposed to be spaced apart from each other in a zigzag manner, thereby forming the plurality of channels in the zigzag manner. However, in the present invention, the number of channels formed by the base part 100 is not limited to a plurality, and only a single channel may be formed. According to another exemplary embodiment, the plurality of channels may not be connected to each other.

Figure 3:
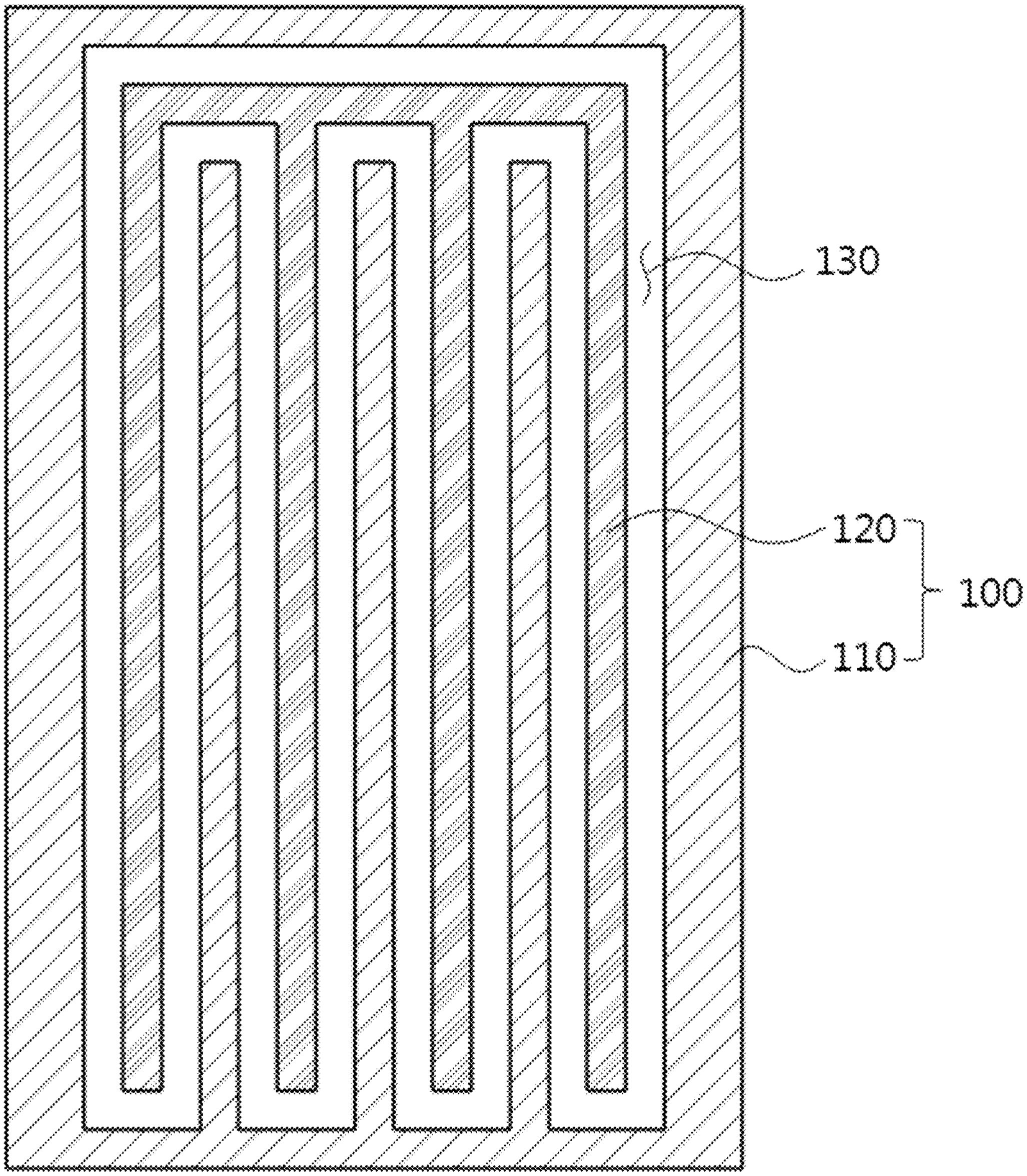
FIG. 3 is a cross-sectional view taken along a horizontal direction of a base part of the flexible thermal conductor according to an exemplary embodiment of the present invention.

FIG. 3 illustrates a cross section of the base part 100 described above in a horizontal direction.

As illustrated in FIG. 3, the first base member 110 and the second base member 120 which are included in the base part 100 are disposed to be separated from and spaced apart from each other, thereby forming a plurality of channels 130 that are the portions into which a working fluid is injected and received. Both end portions of each of the channels 130 formed by the first base member 110 and the second base member 120 are bent and connected to each other to form a closed-loop type or a closed type. Both end portions of each of the plurality of channels 130 are bent and connected to each other to form the closed-loop type or the closed type, which may be a characteristic of only the flexible flat plate pulsating heat pipe.

However, the present invention is not limited to the first base member 110 and the second base member 120 being disposed to be separated from and spaced apart from each other. According to another exemplary embodiment, the plurality of channels 130 in which the first base member 110 and the second base member 120 are connected to each other are formed to form the closed-loop type or the closed type, and the first base member 110 and the second base member 120 are connected to each other to facilitate storage and fabrication.

The base part 100 may be formed of a thermoplastic polymer. The reason why the base part 100 is formed of a thermoplastic polymer material is that the base part 100 has some degree of flexibility. Examples of the thermoplastic polymer capable of forming the base part 100 include polycarbonate, organic polymer, polyethylene, polyester, acrylic-based polymer, and the like.

An upper surface and a lower surface of the base part 100, that is, an upper surface or a lower surface of each of the first base member 110 and the second base member 120 may be plasma-treated, siloxane-based surface modified, and then plasma-treated again. This is to increase adhesion between the base part 100 and surface films to be described later, and the upper surface or the lower surface of the base part 100 may be oxidized through the plasma treatment-siloxane-based surface modification-plasma treatment to improve the adhesion.

A pair of surface films are bonded to the upper and lower surfaces of the base part 100, respectively, to seal the channels 130 formed by the base part 100. In the present exemplary embodiment, the pair of surface films may be an upper film 210 and a lower film 220 illustrated in FIG. 2.

As illustrated in FIG. 2, the upper film 210 and the lower film 220 have the same area as each other and may have the area greater than an area of the base part 100 to cover the base part 100 while being bonded to an upper portion and a lower portion of the base part 100. However, the present invention is not limited to the upper film 210 and the lower film 220 having the same area as each other. According to another exemplary embodiment, the area of the upper film 210 and the lower film 220 is larger than the area of the base part 100, and the upper film 210 or the lower film 220 has a larger area than other films.

Figure 4:
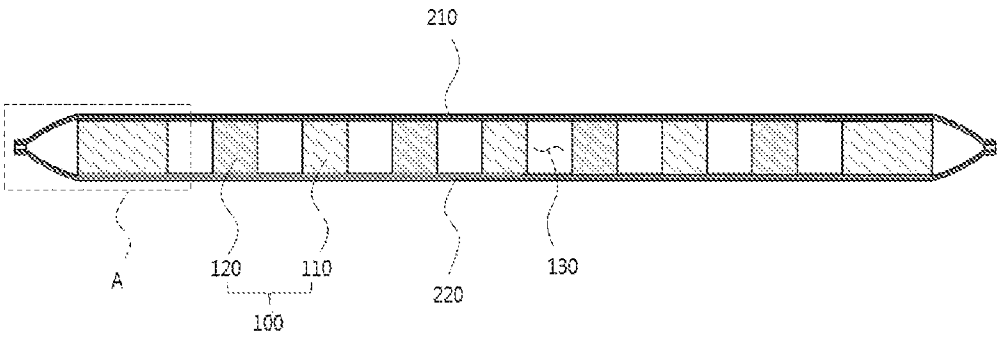
FIG. 4 is a cross-sectional view taken along a vertical direction of the flexible thermal conductor according to an exemplary embodiment of the present invention.

FIG. 4 schematically illustrates a cross section in a vertical direction of the flexible thermal conductor according to an exemplary embodiment of the present invention in a state in which the base part 100 and the surface films (upper film and lower film) are bonded to each other.

As illustrated in FIG. 4, the upper film 210 and the lower film 220 may be bonded to each other at an outer portion of the base part 100, thereby sealing the plurality of channels 130 formed by the base part 100.

Figure 5:
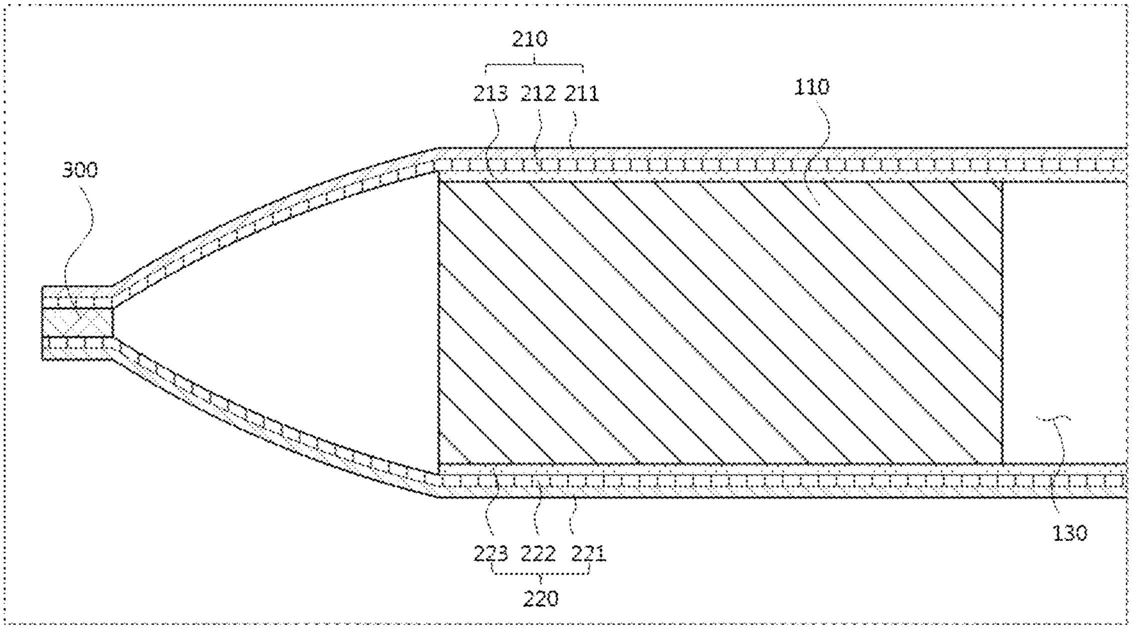
FIG. 5 is a partially enlarged view of FIG. 4.

FIG. 5 is an enlarged view of part A of FIG. 4.

As illustrated in FIG. 5, the upper film 210 may include an upper film layer 211, an upper blocking layer 212, and an upper silicon layer 213.

The upper film layer 211 may be formed of a polymer material such as polyimide to provide flexibility to the upper film 210 and may be formed at the outermost portion of the upper film 210 to protect the upper blocking layer 212. In addition to this, the upper film layer 211 may be formed of all engineering plastics such as polyethylene terephthalate (PET), polyurethane, polybutylene terephthalate, and the like.

The upper blocking layer 212 prevents the working fluid contained in the channels 130 from escaping to the outside while sealing the channels 130 so that no external gas flows into the channels 130, and may be a thin film formed of a metal material. Some examples of the metal material from which the upper blocking layer 212 may be formed include copper (Cu), aluminum (Al), stainless steel, platinum (Pt), carbon steel, and the like, but the material of the upper blocking layer 212 is not limited thereto and all kinds of metals may be used.

In the present exemplary embodiment, the material of the upper blocking layer 212 is limited to copper or aluminum and a thickness thereof is limited because, in order to apply the flexible thermal conductor according to the present invention to a flexible electronic device or a wearable device, the flexible thermal conductor has to have flexibility. In addition, in order to effectively prevent gas penetration, the upper blocking layer 212 may be formed to have a thickness of 10 μm or more.

The upper silicon layer 213 formed to increase the adhesion with the base part 100 may be formed by coating a silicon-based material on one surface of the upper blocking layer 212 (one surface in a direction of the base part 100). In a state in which the upper silicon layer 213 is plasma-treated in the same manner as the base part 100 to have increased adhesion, the upper silicon layer 213 may be in contact with the upper surface of the base part 100 to increase the adhesion.

As illustrated in FIG. 5, the lower film 220 may include a lower film layer 221, a lower blocking layer 222, and a lower silicon layer 223. The lower film layer 221, the lower blocking layer 222, and the lower silicon layer 223 correspond to the upper film layer 211, the upper blocking layer 212, and the upper silicon layer 213 of the upper film 210, respectively, and may have the same role, material, and shape as the upper film layer 211, the upper blocking layer 212, and the upper silicon layer 213. However, the material of each layer of the upper film 210 and the lower film 220 may vary depending on the use or environment of the present invention. For example, when it is assumed that the heat transfer is not performed on the upper portion of the flexible thermal conductor of the present invention and an evaporation part and a condensation part are formed on the lower portion of the flexible thermal conductor to perform the heat transfer, each layer of the upper film 210 may be formed of a material that is advantageous for heat insulation, that is, a material having a low heat transfer coefficient, and the lower film 220 may be formed of a material having a high heat transfer coefficient.

In the present invention, the upper surface and the lower surface of the base part 100 are respectively oxidized by plasma treatment, and the silicon layers of the upper film 210 and the lower film 220 are also oxidized by plasma treatment. Since the degree of oxidation of the upper and lower surfaces of the base part 100 and the silicon layers which are plasma-treated is determined by the degree of plasma, the degree of oxidation of the base part 100, the upper film 210, and the lower film 220 may be adjusted through the adjustment of the degree of plasma in a plasma processing to adjust the adhesion and expand the material to be plasma treated to all the polymer materials. As a result, it is easy to fabricate the flexible thermal conductor having higher adhesion and it is possible to fabricate the flexible thermal conductor having various characteristics.

As described above, the upper surface and the lower surface of the base part 100 are bonded to the upper film 210 and the lower film 220, respectively. Thereafter, the base part 100, the upper film 210, and the lower film 220 are heated and pressurized to be bonded to each other, so that the channels 130 formed by the base part 100 may be completely sealed. However, the method for bonding the upper film 210 and the lower film 220 to the base part 100 according to the present invention is not limited to the pressurization and heating method described above. According to another method, the surface films and the base part 100 may also be bonded to each other only by pressurizing the upper film 210 and the lower film 220 in the direction of the base part 100 at room temperature. The time at which the bonding is completed is reduced in the method of pressurizing and heating the upper film 210 and the lower film 220 in the direction of the base part 100 as compared to the method of pressurizing the upper film 210 and the lower film 220 at the room temperature. Therefore, the user using the manufacturing method of the flexible thermal conductor according to the present invention may selectively select one of the method of pressurizing the upper film 210 and the lower film 220 at the room temperature, and the method of pressurizing and heating the upper film 210 and the lower film 220, which are the methods described above.

As illustrated in FIG. 5, the upper silicon layer 213 and the lower silicon layer 223 may not be formed at the outer portion of the base part 100 in which the first base member 110 and the channel 130 are not positioned, and end portions of the upper film 210 and the lower film 220 may be bonded to each other by soldering using a soldering member 300. The reason for bonding the end portions of the upper film 210 and the lower film 220, that is, the upper blocking layer 212 and the lower blocking layer 222 through the soldering member 300 is to prevent air or non-condensed gas from flowing into the pulsating heat pipe through a space between the upper blocking layer 212 and the lower blocking layer 222. To this end, the upper silicon layer 213 and the lower silicon layer 223 are not formed up to end portions of the respective films to expose the upper blocking layer 212 and the lower blocking layer 222 which are formed of a metal material. As a result, the upper blocking layer 212 and the lower blocking layer 222 may be in surface contact with each other at the end portions of the films and may be soldered through the soldering member 300. In FIG. 5, the soldering member 300 is formed only at the end portions of the upper film 210 and the lower film 220, but the present invention is not limited thereto. According to another exemplary embodiment, the soldering member 300 illustrated in FIG. 5 may also extend to a side surface of the first base member 110 by forming a layer on one surface of the upper blocking layer 212 or the lower blocking layer 222.

However, the present invention does not limit the method of bonding the upper film 210 and the lower film 220 to each other at the end portions thereof to the soldering using the soldering member 300. According to another exemplary embodiment, the upper blocking layer 212 of the upper film 210 and the lower blocking layer 222 of the lower film 220 are bonded to each other by welding using a welding member, thereby making it possible to prevent air or non-condensed gas from flowing into the heat pipe from the outside.

Since an operating efficiency of the pulsating heat pipe increases when a pressure difference between the adjacent channels is large, it is advantageous to use a working fluid having a large difference in saturated vapor pressure depending on the temperature. Therefore, the working fluid contained in the channels 130 according to the present exemplary embodiment may be r-type refrigerants (r-134, etc.) or HFE-700 rather than water. Here, when the saturated vapor pressure is 1 atmosphere, the temperature is below zero or 30 degrees Celsius or less even if the temperature is high. Therefore, internal pressure (pressure of the channels 130) of the pulsating heat pipe operating at such a temperature or higher becomes 1 atmosphere or more.

The flexible thermal conductor according to the present invention described above has the flexibility to be applied to a flexible electronic device such as a flexible smart phone or a wearable device, while improving sealing ability to prevent the gas from penetrating into the inside thereof from the outside.

[Manufacturing Method of Flexible Thermal Conductor]

Hereinafter, a manufacturing method of a flexible thermal conductor according to an exemplary embodiment of the present invention will be described in detail with reference to the accompanying drawings. A thermal conductor manufactured in the manufacturing method of the flexible thermal conductor according to an exemplary embodiment of the present invention is the same as the flexible flat plate pulsating heat pipe which is the flexible thermal conductor described above, and the configurations of the same name or drawing number are considered to have the same configuration. However, in the present invention, the manufacturing method of the flexible thermal conductor to be described below is not limited to the manufacturing of the flexible flat plate pulsating heat pipe.

Figure 6:
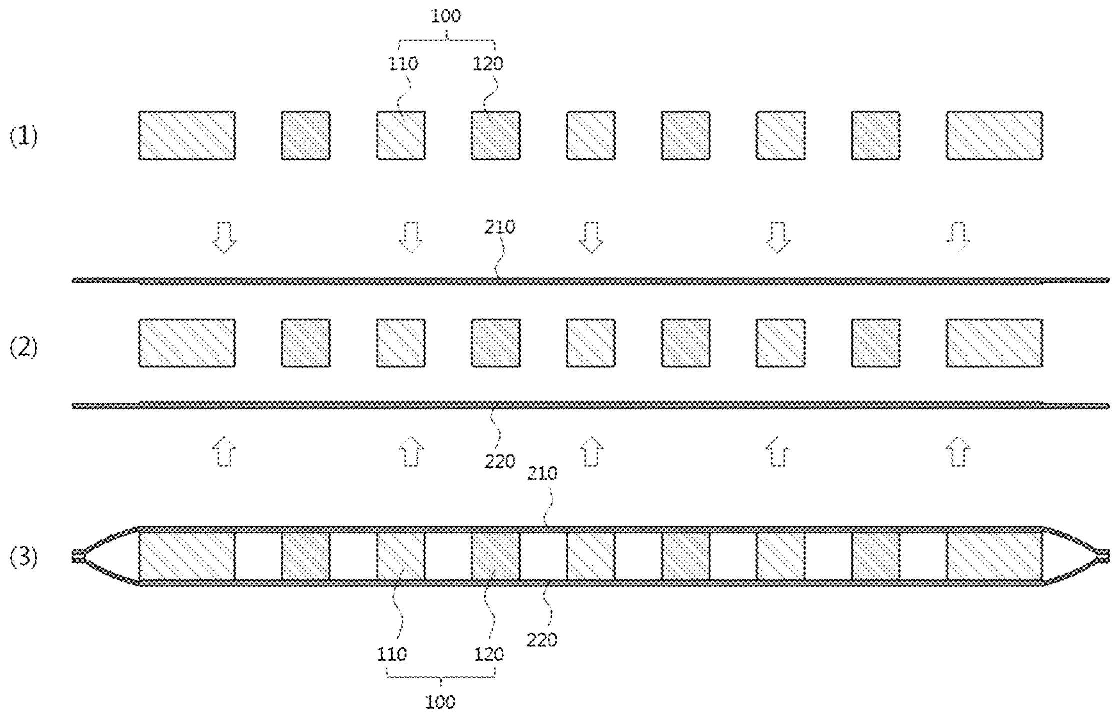
FIG. 6 is a view schematically illustrating the order of a manufacturing method of a flexible thermal conductor according to an exemplary embodiment of the present invention.

FIG. 6 schematically illustrates the order of a manufacturing method of a flexible thermal conductor according to an exemplary embodiment of the present invention.

The manufacturing method of the flexible thermal conductor according to an exemplary embodiment of the present invention may include Step a) and Step b).

Step a) corresponds to a process of (1) illustrated in FIG. 6, and in Step a), a base part 100 is prepared. An upper and a lower surface of the base part 100 are plasma-treated, siloxane-based surface modified, and then plasma-treated again to oxidize the upper surface and the lower surface of the base part 100, thereby improving adhesion between the upper surface and the lower surface of the base part 100. The degree of plasma treatment of the upper surface and the lower surface of the base part 100 in Step a) may vary depending on the process or the thermoplastic polymer material constituting the base part 100.

Step b) corresponds to a process of (2) illustrated in FIG. 6, and in Step b), surface films, that is, an upper film 210 and a lower film 220 are prepared and are then bonded to the base part 100. One surface (one surface of the base part 100 side) of an upper blocking layer 212 and a lower blocking layer 222 included in the upper film 210 and the lower film 220, respectively, may be coated with a silicon material to form an upper silicon layer 213 and a lower silicon layer 223, respectively.

Before the upper film 210 and the lower film 220 are bonded to the base part 100, the upper silicon layer 213 and the lower silicon layer 223 may be each plasma-treated and oxidized to improve adhesion.

When the upper film 210 and the lower film 220 are bonded to the base part 100 in Step b), the upper silicon layer 213 and the lower silicon layer 223 are bonded to an upper surface and a lower surface of the base part 100, respectively, by heating the upper film 210 and the lower film 220 while pressurizing the upper film 210 and the lower film 220 in a direction of the base part 100 as illustrated in the process of (2) illustrated in FIG. 6, thereby making it possible to seal channels 130 formed by the base part 100. However, the method for bonding the upper film 210 and the lower film 220 to the base part 100 in Step b) according to the present invention is not limited to the pressurization and heating method described above. According to another method, the surface films and the base part 100 may also be bonded to each other only by pressurizing the upper film 210 and the lower film 220 in the direction of the base part 100 at room temperature. The time at which the bonding is completed is reduced in the method of pressurizing and heating the upper film 210 and the lower film 220 in the direction of the base part 100 in Step b) as compared to the method of pressurizing the upper film 210 and the lower film 220 at the room temperature. Therefore, the user using the manufacturing method of the flexible thermal conductor according to the present invention may selectively select one of the method of pressurizing the upper film 210 and the lower film 220 at the room temperature, and the method of pressurizing and heating the upper film 210 and the lower film 220, which are the methods described above.

In Step b), end portions of the upper film 210 and the lower film 220, that is, outer portions of the base part 100 may be soldered and bonded to each other. In this case, the upper silicon layer 213 and the lower silicon layer 223 are not formed up to the end portions of the upper film 210 and the lower film 220 and are formed only up to the portions where the base part 100 is formed so that the upper film 210 and the lower film 220 may be soldered, thereby making it possible to bring blocking layers formed of a metal included in the upper film 210 and the lower film 220, respectively, into contact with each other at the outer portion of the base part 100.

However, the present invention does not limit the method of bonding the upper film 210 and the lower film 220 to each other at the end portions thereof in Step b) to the soldering using the soldering member 300. According to another exemplary embodiment, the upper blocking layer 212 of the upper film 210 and the lower blocking layer 222 of the lower film 220 are bonded to each other by welding using a welding member in Step b), thereby making it possible to prevent air or non-condensed gas from flowing into the heat pipe from the outside.

When Steps a) and b) described above are performed, the flexible thermal conductor is finally manufactured as in a process of (3) of FIG. 6.

The manufacturing method of the flexible thermal conductor according to the present invention may further include a step of injecting a working fluid into the channels 130 of the base part 100 during the bonding of the surface films and the base part 100. The step of injecting of the working fluid may further include a step of fixing a silica tube on the flexible thermal conductor by bonding the upper film 210 and the lower film 220 to each other except for a portion into which the silica tube for injection of the working fluid may be inserted, inserting the silica tube into a portion at which the bonding is not performed, and then applying a vacuum epoxy or a ceramic to a periphery of the silica tube.

According to the flexible thermal conductor and the manufacturing method thereof according to the present invention as described above, the working fluid inside the pulsating heat pipe may be effectively sealed through a simple process, the penetration of the gas from the outside may be effectively blocked, since the adhesion between the base part and the surface films is excellent, the product to which the flexible thermal conductor according to the present invention is applied may be used for a long period of time, or the sealing may be maintained even through a large number of flexures occur, and the pulsating heat pipe has a simpler structure than the conventional pulsating heat pipe having flexibility, so that the economical efficiency may be excellent.

The present invention is not limited to the above-mentioned exemplary embodiments, and may be variously applied, and may be variously modified without departing from the gist of the present invention claimed in the claims.

DETAILED DESCRIPTION OF MAIN ELEMENTS

100: base part
110: first base member
120: second base member
130: channel
210: upper film
211: upper film layer
212: upper blocking layer
213: upper silicon layer
220: lower film
221: lower film layer
222: lower blocking layer
223: lower silicon layer
300: soldering member

What is claimed is:

1. A flexible flat plate pulsating thermal conductor comprising:

a base part, the base part having an upper surface and a lower surface, at least one of the base part upper surface and the base part lower surface exhibiting a plasma-treated surface, wherein the base part defines at least one open channel therein;

the at least one of the base part upper surface and the base part lower surface exhibiting a plasma-treated surface being siloxane-based surface modified, and thereafter the siloxane-based modified surface exhibiting a plasma-treated surface; and a pair of surface films, a first one of the pair of surface films bonded to the base part upper surface and a second one of the pair of surface films bonded to the base part lower surface and wherein outer portions of the first one of the pair of surface films and outer portions of the second one of the pair of surface films extend beyond the base part whereby the outer portions of the first one of the pair of surface films and the outer portions of the second one of the pair of surface films are bonded to each other;

wherein each of the first one and the second one of the pair of surface films comprise:

a blocking layer preventing gas penetration so that the sealed channel can maintain a vacuum state; a silicon layer on one surface of the blocking layer whereby the silicon layer is positioned so as to be in contact a surface of the base part; and a film layer formed on an opposed surface of the blocking layer; and wherein the surface of the silicon layer positioned to be in contact with a surface of the base part exhibiting a plasma-treated surface.

2. The flexible flat plate pulsating thermal conductor of claim 1, wherein the base part defines a plurality of channels formed therein, at least two of the plurality of channels having a first end portion and a second end portion and both the first end portion and the second end portion of each of the at least two of the plurality of channels are bent and connected to each other to form a closed-loop flexible flat plate pulsating heat pipe.

3. The flexible flat plate pulsating thermal conductor of claim 1, wherein the base part and the surface films are pressurized when bonded to each other.

4. The flexible flat plate pulsating thermal conductor of claim 1, wherein the base part and the surface films are heated when bonded to each other.

5. The flexible flat plate pulsating thermal conductor of claim 1, wherein the blocking layer is formed of a metal material.

6. The flexible flat plate pulsating thermal conductor of claim 1, wherein the base part is formed of a thermoplastic polymer.

7. The flexible flat plate pulsating thermal conductor of claim 1, wherein the bonding of the outer portions of the first one and the outer portions of the second one of the pair of surface films to each other is a soldered or welded bond.

* * * * *